US006657474B2

(12) United States Patent
Varadarajan

(10) Patent No.: US 6,657,474 B2
(45) Date of Patent: Dec. 2, 2003

(54) CIRCUITS FOR A LOW SWING CLOCKING SCHEME

(75) Inventor: Hemmige D. Varadarajan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/083,584

(22) Filed: Feb. 27, 2002

(65) Prior Publication Data

US 2003/0160646 A1 Aug. 28, 2003

(51) Int. Cl.[7] .............................. G06F 1/04; H03K 3/00
(52) U.S. Cl. ...................... 327/291; 327/293; 327/295; 327/333
(58) Field of Search ................................ 327/292, 293, 327/295, 297, 299, 333, 291

(56) References Cited

U.S. PATENT DOCUMENTS 5,774,007 A * 6/1998 Soneda ........................ 327/292
6,323,714 B1 * 11/2001 Naffziger et al. ............ 327/295
6,433,606 B1 * 8/2002 Arai ............................ 327/291
6,466,074 B2 * 10/2002 Vakil et al. .................. 327/295

OTHER PUBLICATIONS

Varadarajan, Hemmige; Kumar, Sudarshan; Reitsma, Mike; Madhyastha, Sadhana; Design Comparison: Differential and Single-ended Clock Networks; Intel Design and Test Technology Conference; p. 1–5; 2000.

Varadarajan; Advanced Circuit Design; Food for Thought on Lowering Power and/or Raising uP Performance; Chapter 8; p. 81–8–10, Sep. 19, 2000.

* cited by examiner

Primary Examiner—Tuan T Lam
(74) Attorney, Agent, or Firm—Kenyon & Kenyon

(57) ABSTRACT

In a clocking network with clock distribution in the gigahertz frequencies, low voltage swings are generated and applied instead of full voltage swings. The low voltage swing circuits are differential low voltage swing circuits. True and complement signals are transmitted in the global path, enabling cancellation of common mode noise picked up along the path from the generation point to the destination local ends, where the noise is subtracted from the signals. The low voltage swing circuits include a differential translator/driver, differential repeaters and differential receivers/translators to enable centrally generated low voltage swing clock signals to be distributed throughout the chip and to be faithfully converted to full voltage swing clock signals at the local ends. The input sections of the translator/driver convert a full voltage swing clock signal to a differential pair of low voltage swing clock signals, the differential repeaters are provided to repeat the low voltage swing clock signals to cover the paths up to the respective differential receivers/translators, and the differential receivers/translators convert the low voltage swing clock signals to full voltage swing clock signals.

15 Claims, 10 Drawing Sheets

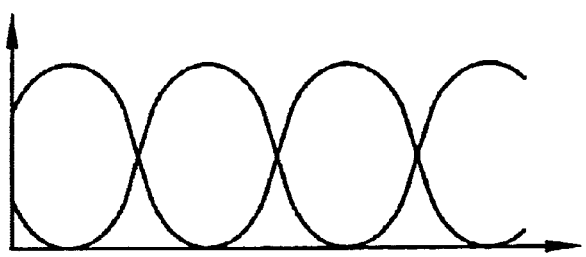
FIG.4A  DIFFERENTIAL FULL VOLTAGE SWING PLL OUTPUT
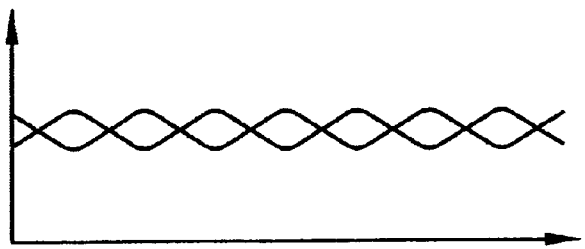
FIG.4B  DIFFERENTIAL LOW VOLTAGE SWING TRANSLATOR/DRIVER OUTPUT
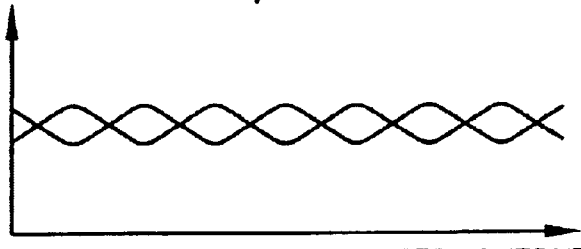
FIG.4C  FIRST DIFFERENTIAL REPEATER OUTPUT
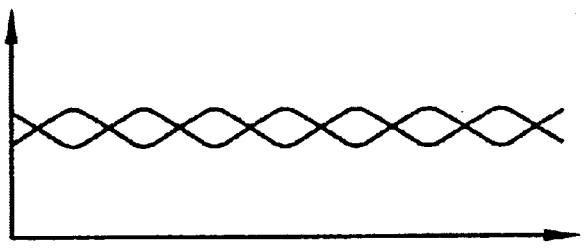
FIG.4D  SECOND DIFFERENTIAL REPEATER OUTPUT
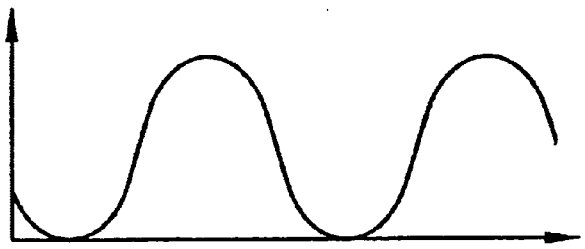
FIG.4E  SINGLE-ENDED FULL VOLTAGE SWING RECEIVER/TRANSLATOR OUTPUT

CIRCUITS FOR A LOW SWING CLOCKING SCHEME

FIELD OF THE INVENTION

The present invention relates to a system in which a low voltage swing differential global clock network is applied on an integrated circuit chip.

BACKGROUND

In integrated circuits, inverters may be used to drive clock signals from a generation point where the signals are generated to the various points on an integrated circuit chip. The inverters are distributed throughout the integrated circuit chip, and function as inverting amplifiers which amplify the signals to compensate for any loss of signal occurred during propagation from the generation point at a central location to the various points on the chip.

FIG. 1 shows one exemplary embodiment of a full voltage swing clocking network, where the signals are driven from a generation point at a central location to receiving points at the four corners of an integrated circuit chip. As shown in FIG. 1, signals generated at the central location are driven to the corners, or local ends, through a network. This network, or clock tree 10, radiates from the phase locked loop (PLL) to the local ends, and includes a plurality of inverters 101. Each inverter 101 provides full voltage swing signals from ground to the supply voltage.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

FIGS. 4A–4E show the waveforms of the input signals at various points in the clocking network of FIG. 3.

DETAILED DESCRIPTION

Figure 1:
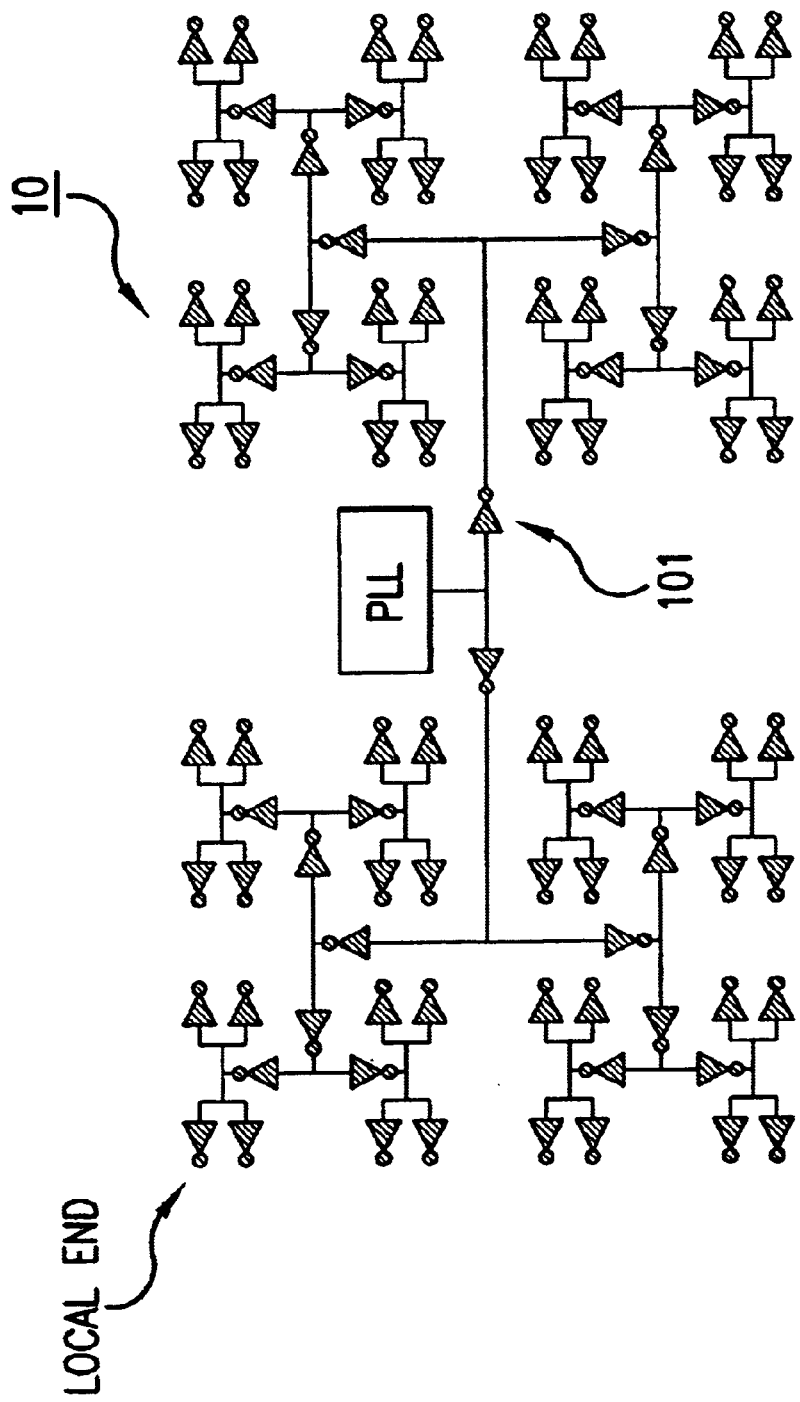
FIG. 1 illustrates an exemplary full voltage swing clocking network.

In the full voltage swing clocking network of FIG. 1, with clock distribution in the gigahertz frequencies, a variety of constraints may arise due to the small period of the clock cycle. Delays may vary in the various distribution paths from the generation point to receiving points at the local ends. Further, time and location variation of delays, i.e. jitter and skew respectively, usually caused by noise in the supply rails and noise picked up in the distribution paths may increase. Thus, a substantial portion of the clock cycle may become lost and unusable in synchronous system design and operation, and power dissipation may be increased.

In accordance with the various exemplary embodiments of this invention, low voltage swings are generated and applied instead of full voltage swings. In these various embodiments, by using devices which produce low voltage swings and which may not be driven as hard as devices producing full voltage swings, power savings may be significantly obtained. Moreover, low voltage swing circuits may also produce low supply rail noise since the peak currents are smaller than those producing high voltage swings.

In accordance with the various exemplary embodiments of this invention, the low voltage swing circuits are differential low voltage swing circuits. In these differential circuits, true and complement signals are transmitted in the global path, enabling cancellation of common mode noise picked up along the path from the generation point to the destination local ends, where the noise is subtracted from the signals.

In accordance with the various exemplary embodiments of this invention, a low voltage swing circuit includes a differential translator/driver, differential repeaters and differential receivers/translators to enable centrally generated low voltage swing clock signals to be distributed throughout the chip and to be faithfully converted to full voltage swing clock signals at the local ends. In these various embodiments, the input sections of the translator/driver convert a full voltage swing clock signal to a differential pair of low voltage swing clock signals, the differential repeaters are provided to repeat the low voltage swing clock signals to cover the paths up to the respective differential receivers/translators, and the differential receivers/translators convert the low voltage swing clock signals to full voltage swing clock signals. Accordingly, the low voltage swing differential networks of this invention address at least the requirements for high bandwidth and low skew with power and area efficiency. Further, in these various exemplary embodiments, the input sections of the differential translator/driver, repeaters and receivers/translators operate as current mode linear circuits.

Figure 2:
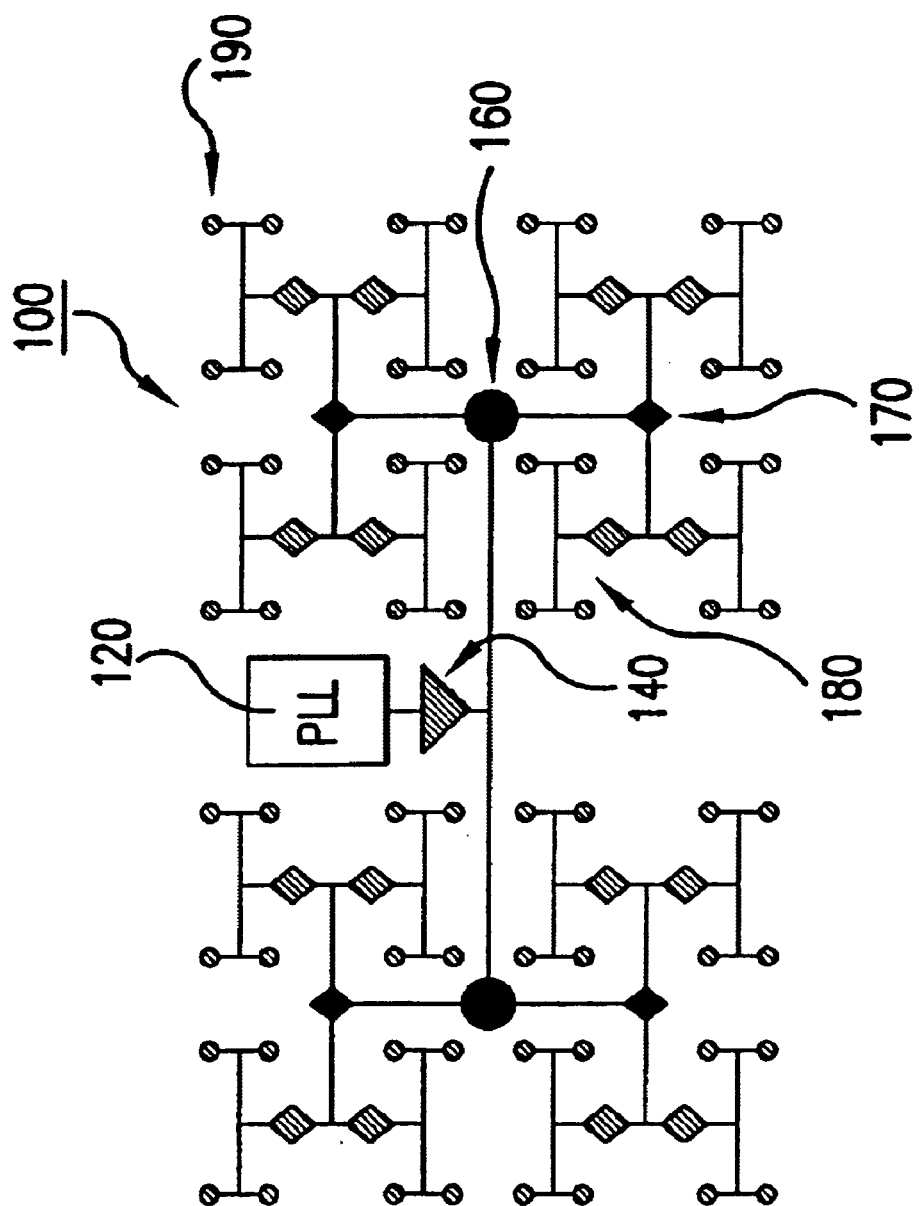
FIG. 2 illustrates an exemplary low voltage swing differential clocking network according to this invention.

FIG. 2 shows one exemplary embodiment of a low voltage swing differential clocking network with partitioned clocking regions in accordance with this invention. Due to possible clock propagation bandwidth degradation and within die variations, in the exemplary embodiment of FIG. 2, the clocking network 100 is partitioned into small clocking regions, with the skew within the clock regions tightly controlled.

As shown in FIG. 2, clocking network 100 includes a phase locked loop (PLL) 120, a differential translator/driver 140, first differential repeaters 160, second differential repeaters 170, differential-single-ended receivers/translators 180, and final load driving inverters 190. Full swing complementary clock signals generated at the phase locked loop (PLL) 120 enter the translator/driver 140, and then pass via a corresponding one of the first differential repeaters 160, to a corresponding one of the second differential repeaters 170, followed by a corresponding one of the differential receivers/translators 180, and then a corresponding one of final load driving inverters 190 at the local end.

Figure 3:
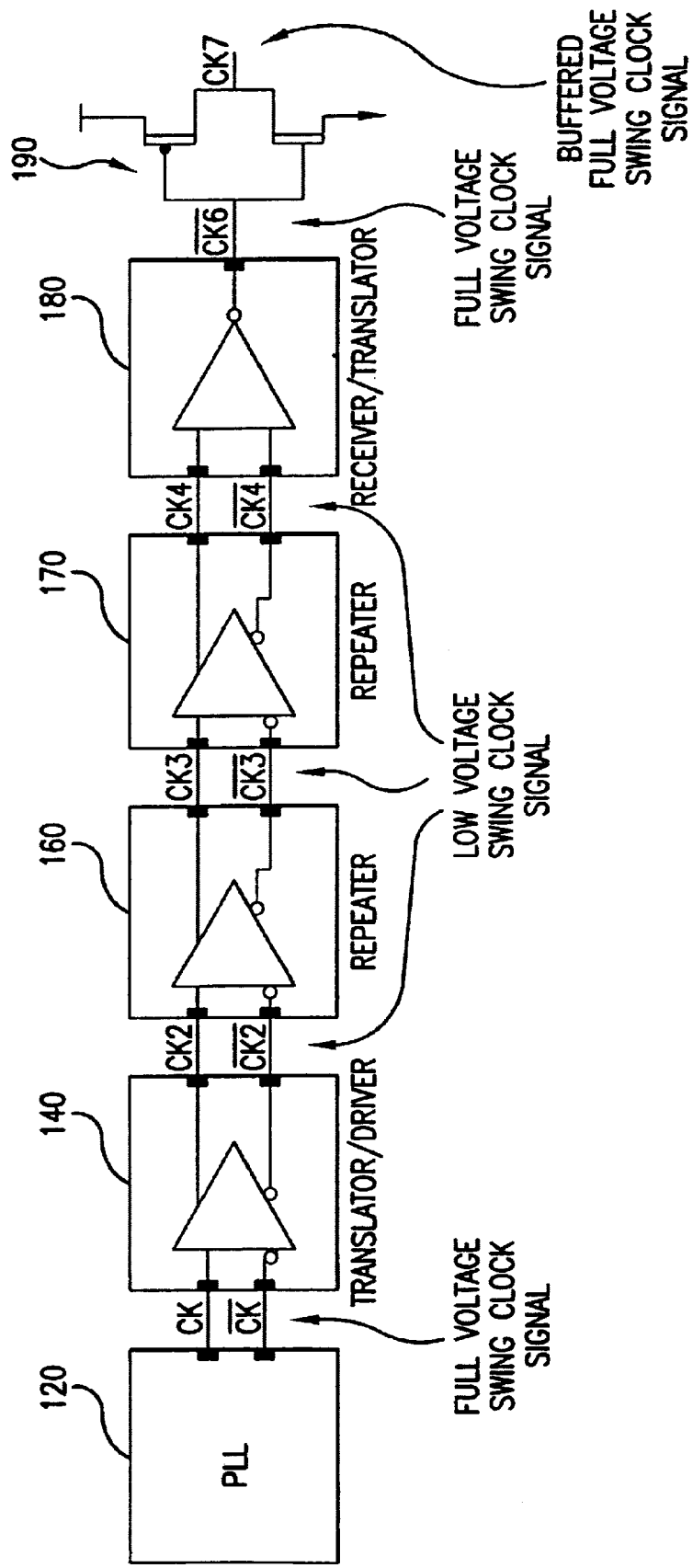
FIG. 3 illustrates an exemplary conceptual diagram of a branch of the clocking network of FIG. 2.

FIG. 3 shows an exemplary conceptual view of the differential network of FIG. 2. As shown in FIG. 3, a pair of full voltage swing differential clocks CK and CK_bar is fed from the phase locked loop (PLL) 120 to the translator/driver 140. The translator/driver 140 converts the full voltage swing clocks CK and CK_bar from the phase locked loop (PLL) 120 to two complementary low voltage swing clock outputs CK2 and CK2_bar, which proceed to a first differential repeater 160. The first differential repeater 160 sends its outputs CK3 and CK_bar to a second differential repeater 170. The low voltage swing clocks CK4 and CK4_bar then proceed to a differential receiver/translator 180, where they are combined to form a single full voltage swing clock output CK6_bar. The full voltage swing clock CK6_bar from the differential single-ended receiver/translator 180 is subsequently fed to the final load driving inverter 190. The output of the final load driving inverter 190 is a full voltage swing clock signal CK7 ready for distribution in the local area.

In accordance with the various exemplary embodiments of this invention, each of the translator/driver, differential repeaters, and receiver/translator includes a differential input pair which reduces or eliminates common mode noise that may be generated in previous circuits or picked up by the wires of the complementary signals. Thus, in the exemplary embodiment set forth in FIG. 3, noise which is common to the complementary signal lines tends to cancel as the signals enter any of the translator/driver 140, first and second differential repeaters 160 and 170, or receivers/translators 180.

FIGS. 4A–4E show the waveforms of the input signals at various points in the clocking network of FIG. 3. As shown in FIG. 4A, the signal output from the phase locked loop (PLL) 120 to the translator/driver 140 is a full voltage swing differential signal. As shown in FIGS. 4B and 4C, the inputs to the first differential repeater 160 the second differential repeater 170 are low voltage swing differential signals. As shown in FIG. 4D, the input to the differential receiver/translator 180 is maintained as a low voltage swing differential signal. As shown in FIG. 4E, the clock signal CLK in the local area is restored as a full voltage swing single-ended signal.

Figure 5:
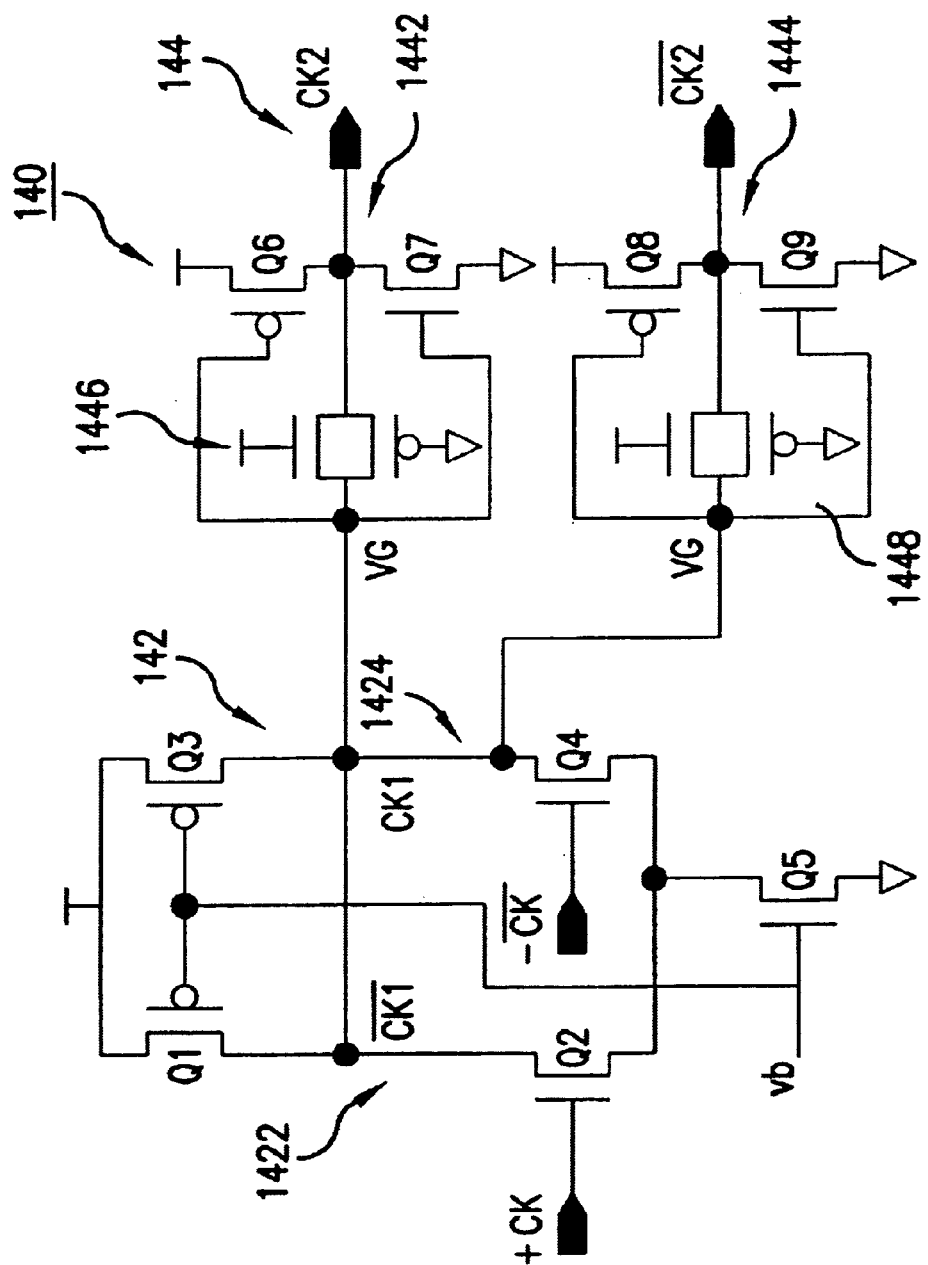
FIG. 5 illustrates an exemplary embodiment of a differential translator/driver of FIG. 3.
Figure 6:
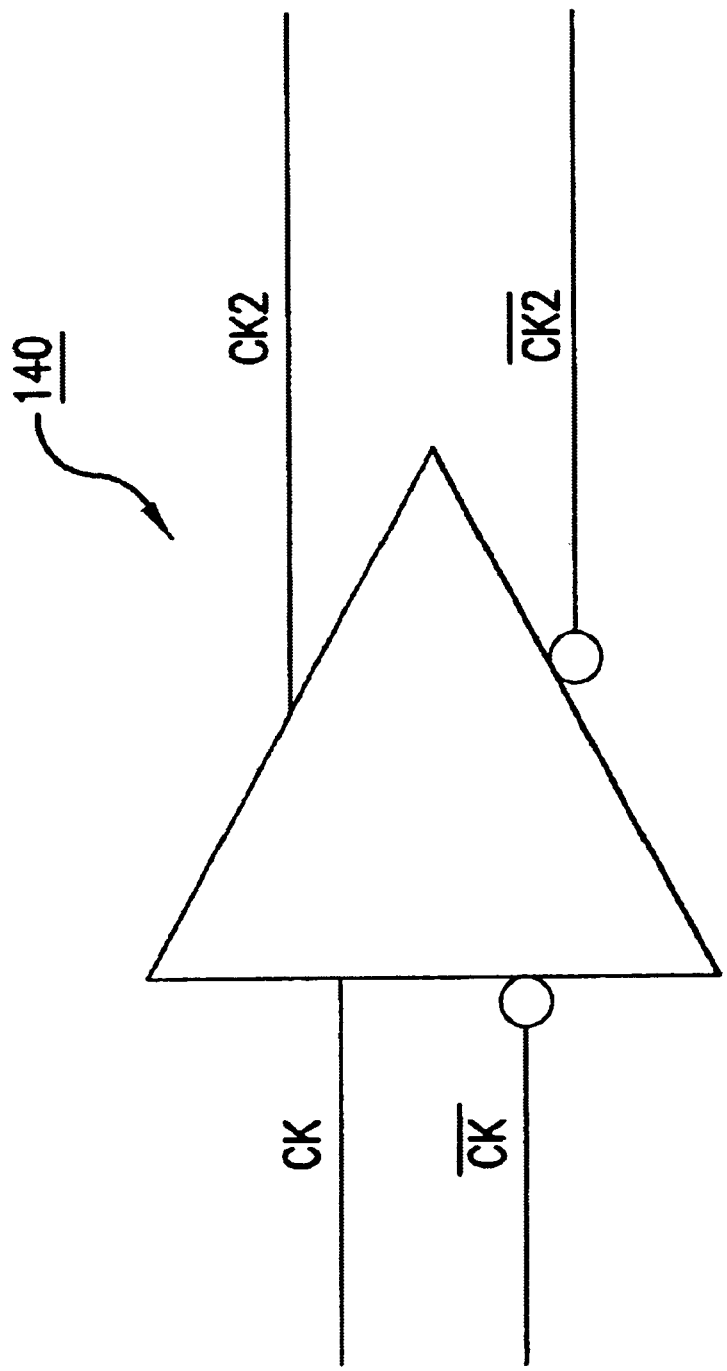
FIG. 6 illustrates a schematic diagram of the differential translator/driver of FIG. 5.

FIGS. 5–8 show exemplary embodiments of the driver/translator, the first differential repeater and the second differential repeater of FIG. 2, respectively. In the exemplary embodiment of FIG. 5, the translator/driver 140 converts full voltage swing clock signals to a differential pair of low voltage swing clock signals and feeds the low voltage swing clock signals to the first differential repeater 160. FIG. 6 shows a schematic diagram of the translator/driver of FIG. 5.

Figure 7:
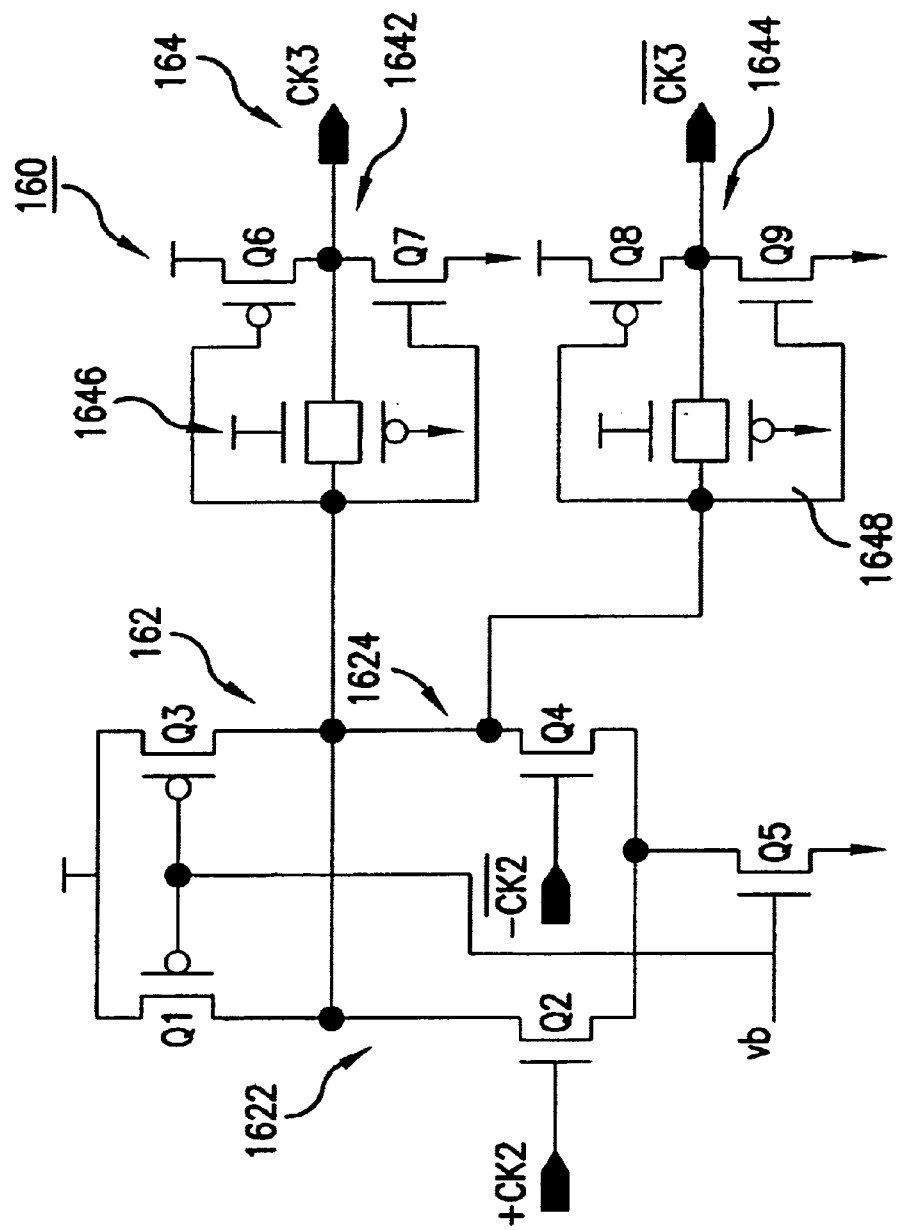
FIG. 7 illustrates an exemplary embodiment of a differential repeater of FIG. 3.
Figure 8:
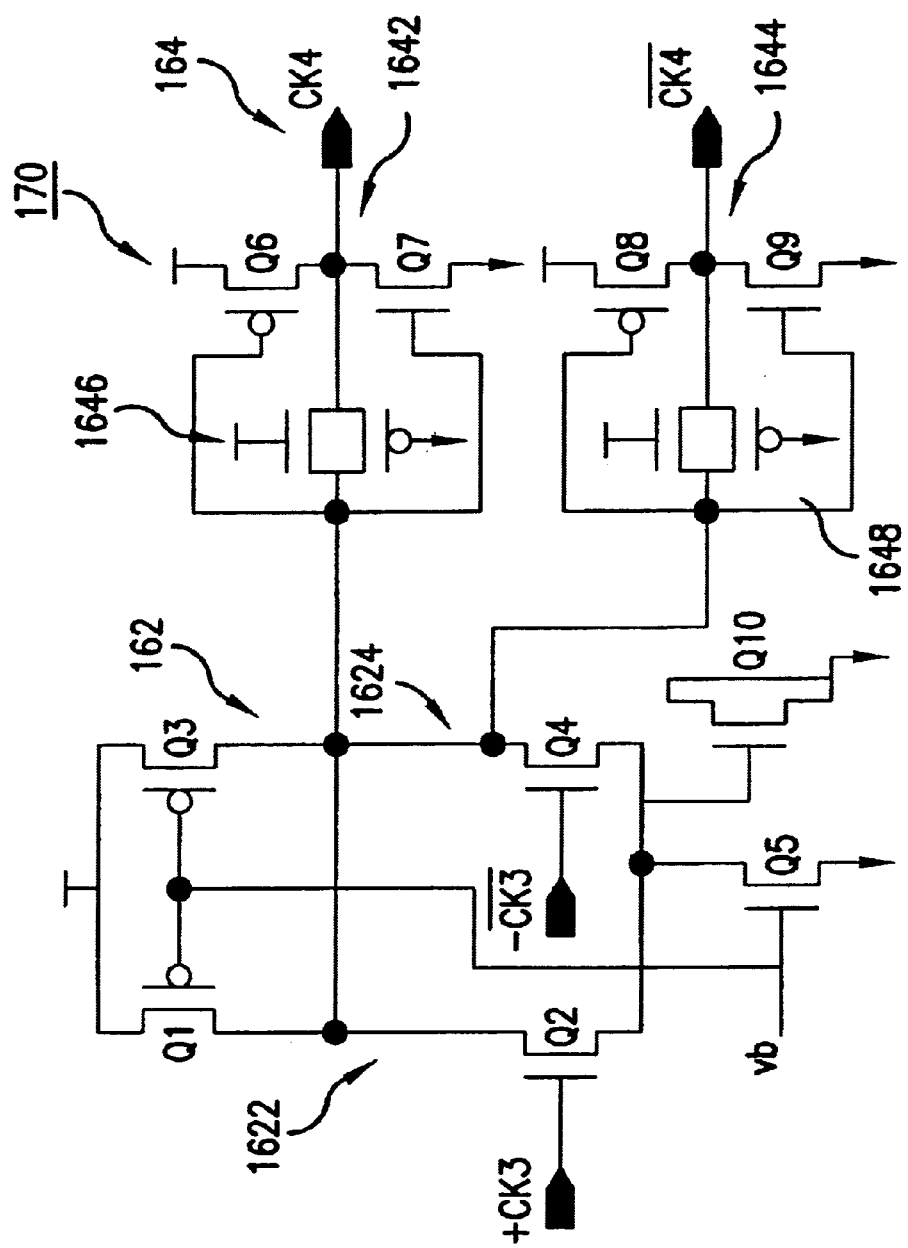
FIG. 8 illustrates an exemplary embodiment of another differential repeater of FIG. 3.

In the exemplary embodiments of FIGS. 7 and 8, the first and second differential repeaters 160 and 170 maintain low voltage swing clock signals throughout the differential network 100 to the differential receivers/translators 180, where a full voltage swing clock signal is restored. That is, in the exemplary embodiments of FIGS. 7 and 8, the first and second differential repeaters 160 and 170 are buffered differential amplifiers used to amplify signals traveling on parallel distribution lines, and thus, they compensate for any attenuation of signals while cancelling common mode noise.

It should be appreciated that the translator/driver 140 and the first and second differential repeaters 160 and 170 used throughout the network in the various exemplary embodiments of this invention may be similar in form with possible minor variations at the beginning and end of the circuits. For example, as shown in FIGS. 5–8, the exemplary embodiment of the differential repeater 170 of FIG. 8 contains a minor variation of the exemplary embodiment of the differential repeater 160 of FIG. 7 and the exemplary embodiment of the translator/driver 140 of FIG. 5.

As shown in FIG. 5, the translator/driver 140 is a current mode amplifier which uses complementary input voltages CK and CK_bar, and a DC bias voltage vb. As shown in FIG. 5, the translator/driver 140 includes a first portion 142 and a second portion 144. In this exemplary embodiment, the first portion 142 functions as a primary differential section which includes a differential pair of first transistors Q1 and Q2 and second transistors Q3 and Q4, and a current source transistor Q5. The differential pair cancels out the common mode of the present stage to drive the next stage of the circuit. As shown in FIG. 5, first transistor Q2 is provided with the input voltage CK, and second transistor Q4 is provided with the complement input voltage CK_bar. First transistor Q1, second transistor Q3 and current source transistor Q5 are provided with the bias voltage vb, and act as current sources which ensure differential operation to cancel common mode noise present in the input voltages CK and CK_bar.

As shown in FIG. 5, the first portion 142 is connected to the second portion 144 via the drains of a pass transistor pair, first transistors Q1 and Q2, and second transistors Q3 and Q4. As shown in FIG. 5, the input of the second portion 144 appears as a virtual ground VG.

The second portion 144 includes a pair of first and second inverters 1442 and 1444 provided between the output and the input of the second portion 144. The first inverter 1442 includes third transistors Q6 and Q7, while second inverter 1444 includes fourth transistors Q8 and Q9. Additionally, as shown in FIG. 5, a pass gate is provided between each of the first and second inverter outputs 1442 and 1444 and the output from the first portion 142. That is, as shown in FIG. 5, pass gate 1446 is provided between the drains of first transistors Q1 and Q2 and the gates of third transistors Q6 and Q7, while pass gate 1448 is provided between the drains of second transistors Q3 and Q4 and the gates of fourth transistors 98 and Q9. These pass gates 1446 and 1448 are provided as feedback devices for the inverters 1442 and 1444.

In the exemplary embodiments of this invention, the second portion 144 is provided to behave as an op-amp which puts out a voltage equal to the current passing through the circuit multiplied by the resistance value of the feedback device pair 1446 and 1448. By providing the feedback, a controlled gain and better bandwidth is obtained. That is, in the second portion 144, the pass gate feedback reduces the output impedance of the two input voltages CK1 and CK1_bar from the first portion 142. Accordingly, the load capacitance of the circuit, for example, may be driven effectively in the second portion 144, and a controlled gain and better bandwidth may be obtained. As shown in FIG. 5, a pair of complementary voltages CK2 and CK2_bar is obtained from the second portion 144.

FIG. 7 shows an exemplary embodiment of a differential repeater of FIG. 3. The first repeater 160 of FIG. 7 is similar to the translator/driver 140 of FIG. 5, and thus, can be represented by the schematic diagram of FIG. 6. That is, as shown in FIG. 7, the first repeater 160 also includes a first portion 162 which functions as a high frequency compensating device to compensate for high frequency, and a second portion 164 provided as an op-amp which outputs a voltage equal to the current passing through the circuit multiplied by the resistance value of the feedback device pair.

In the differential repeater 160 of FIG. 7, the first portion 162 is a differential stage which may be small size to present a low capacitance on the input line, whereas the second portion 164 uses much larger devices to be able to drive the load consisting of interconnections and next portion input gate load. Thus, the differential repeater 160 may be provided with low impedance because of the size of the second portion 164 and the feedback devices. Accordingly, in these exemplary embodiments, the differential repeater 160 is provided as a loss compensating impedance converter to maintain a constant size low voltage swing signal to the output. As shown in FIG. 7, complementary voltages CK3 and CK3_bar are obtained from the differential repeater 160.

FIG. 8 shows another exemplary embodiment of another repeater of FIG. 3. The second repeater 170 of FIG. 8 is similar to the first repeater 160 of FIG. 7, with a minor variation. That is, as shown in FIG. 8, the second repeater 170 also includes a first portion 162 which functions as the input differential pair, and a second portion 164 provided as an op-amp which outputs a voltage equal to the current, passing through the circuit multiplied by the resistance value of the feedback device pair. However, the second repeater 170 differs from the first repeater 160 of FIG. 7 in that an additional transistor Q10 is provided in the first portion 162 as an additional compensating device. This provides better amplification at higher frequencies by acting as a bypass capacitor to ground at the drain of current source transistor Q5. As shown in FIG. 8, complementary voltages CK4 and CK4_bar are obtained from the second repeater 170.

Figure 9:
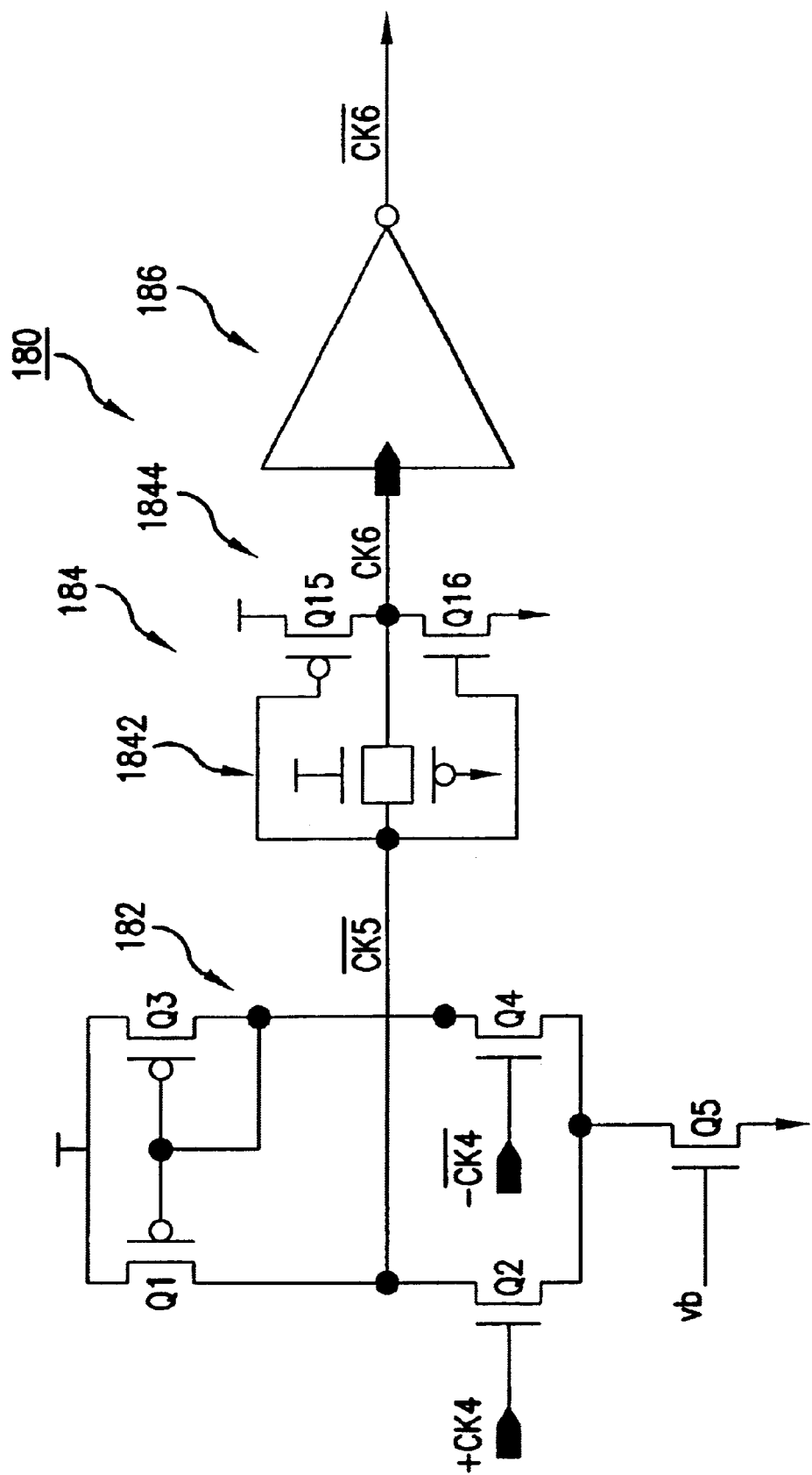
FIG. 9 illustrates an exemplary embodiment of a differential receiver/translator of FIG. 3.
Figure 10:
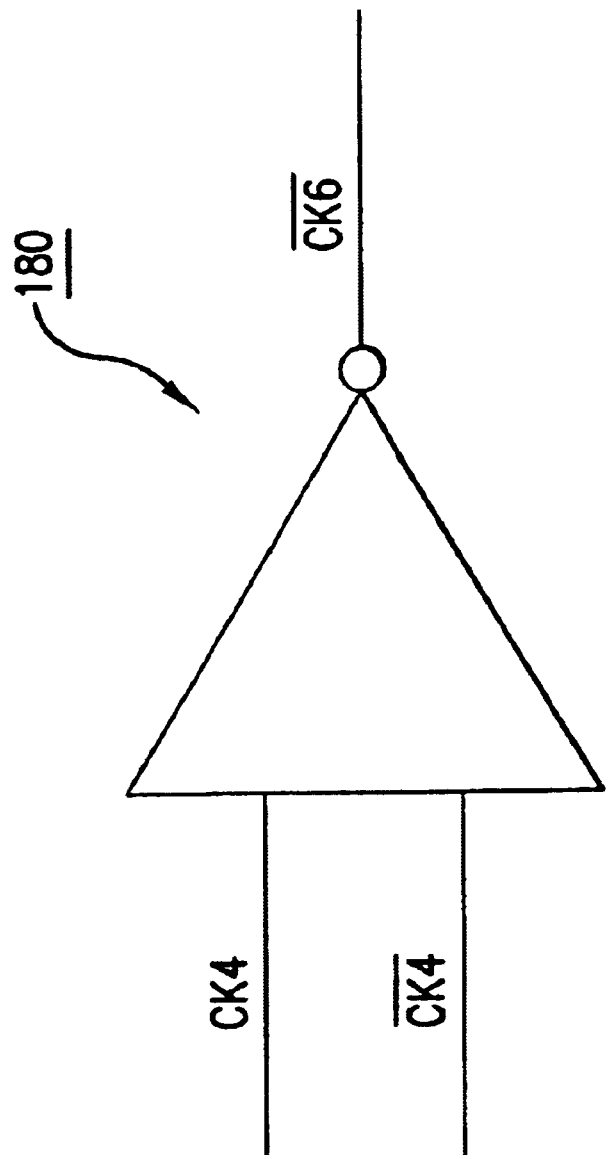
FIG. 10 illustrates a schematic diagram of the differential receiver/translator of FIG. 9.

FIG. 9 shows an exemplary embodiment of the differential receiver/translator of this invention, and FIG. 10 shows the schematic diagram of the differential receiver/translator of FIG. 9. As shown in FIG. 9, the differential receiver/translator 180 includes a first portion 182, a second portion 184 and a third portion 186. As shown in FIG. 9, the first portion 182 is a differential pair that accepts the true and complement signal inputs CK4 and CK4_bar. The second portion 184 comprises an inverter 1844 with a pass gate 1842 as feedback, to produce a large signal with a process-supply voltage-temperature (PVT) tolerant swing at its output. By including the feedback device, the duty cycle may be controllable as the drive to the third portion 186 may be better balanced in the lower and upper half cycles, compensating PVT effects. The third portion 186 is a buffer that generates a near full voltage swing signal CK6_bar, to be buffered by the final load driving inverters 190 to restore the full voltage swing clock signal CK7 to drive local circuits.

As shown in FIG. 9, the first portion 182 includes five transistors Q1–Q5 forming a differential amplifier. The differential clock signals CK4 and CK4_bar are fed to the gate of first transistors Q2 and Q4, respectively. As shown in FIG. 9, the output from the first portion 182 is a single-ended signal CK_bar available at the drains of the transistors Q1 and Q2. As shown in FIG. 9, transistor Q3 is a diode-connected, single-ended drain-to-gate shorted PMOS device that provides automatic bias to transistor Q1. Transistor Q1 behaves as a load current source for this differential amplifier. Transistor Q5 is a current source transistor provided with bias voltage vb.

As shown in FIG. 9, the single-ended signal CK5_bar from the first portion 182 is fed to the second portion 184. As shown in FIG. 9, the second portion 184 includes a pass gate 1842 and an inverter 1844, wherein the pass gate 1842 is provided between the output of the first portion 182 and the inverter 1844 to function as a feedback device for the inverter 1844. As shown in FIG. 9, the inverter 1844 includes third transistors Q15 and Q16. The output from the second portion 184 goes from the drains of the third transistors Q15 and Q16 to the third portion 186 as a single-ended signal CK6.

As shown in FIG. 9, the third portion 186 includes a single inverter. The third portion 186 receives the output CK6 from the second portion 184 and provides the inverted output CK6_bar.

The receiver circuit 180 translates back the incoming low voltage swing signal pair CK4 and CK4_bar to a single-ended full voltage swing signal CK6_bar. This signal CK6_bar, after being amplified and inverted by one of the final load driving inverters 190, is distributed as the last global clock signal CK7.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A system, comprising:
a current mode translator/driver that converts a full voltage swing clock signal to a pair of differential low voltage swing clock signals; and
a plurality of current mode differential receivers/translators that convert the low voltage swing clock signals to full voltage swing clock signals;
wherein the translator/driver comprises a first portion that cancels common mode noise and includes a current source, and a second portion connected to the first portion that reduces output impedance as an op-amp and includes a pair of inverters and a passgate as a feedback device for each of the inverters.

2. The system of claim 1, the first portion comprising a differential pair.

3. The system of claim 1, the second portion comprising inputs which appear as virtual ground.

4. The system of claim 1, further comprising a plurality of current mode differential repeaters that repeat the converted low voltage swing clock signals from the translator/driver to cover paths up to a respective one of the plurality of differential receiver/translators.

5. The system of claim 4, each of the plurality of repeaters being a buffered differential amplifier that amplifies signals traveling on parallel distribution lines to compensate for attenuation of the signals while canceling common mode noise.

6. The system of claim 4, each of the plurality of repeaters comprising a first portion that cancels common mode noise, and a second portion connected to the first portion that reduces output impedance as an op-amp.

7. The system of claim 6, the first portion comprising a differential pair.

8. The system of claim 6, the first portion further comprising a current source.

9. The system of claim 6, the second portion comprising:
a pair of inverters; and
a passgate as a feedback device for each of the inverters.

10. The system of claim 1, further comprising a plurality of load-driving inverters provided at local ends of the system, each load-driving inverters receiving a full voltage swing clock signal from a respective one of the plurality of differential receivers/translators.

11. The system of claim 1, further comprising a phase locked loop that feeds the full voltage swing clock signal to the translator/driver.

12. The system of claim 1, each of the plurality of receivers/translators comprising:
   a first portion that outputs a single-ended signal;
   a second portion comprising a feedback device connected to the first portion; and
   a third portion connected to the second portion that provides an inverted output signal.

13. The system of claim 12, the first portion comprising a plurality of transistors configured as a differential amplifier.

14. The system of claim 12, the second portion comprising:
   an inverter; and
   a passgate as a feedback device for the inverter.

15. The system of claim 12, the third portion comprising an inverter.

* * * * *